Oct. 9, 1956 B. N. SLADE 2,766,410

TRANSISTOR DEVICES

Filed June 18, 1952

INVENTOR.

Bernard N. Slade

BY H. O. Weston

ATTORNEY

United States Patent Office 2,766,410

Patented Oct. 9, 1956

2,766,410

TRANSISTOR DEVICES

Bernard N. Slade, Morristown, N. J., assignor to Radio Corporation of America, a corporation of Delaware Application June 18, 1952, Serial No. 294,293

8 Claims. (Cl. 317—235)

This invention relates generally to semi-conductor devices and particularly to semi-conductor devices of the type known as transistors. It is a primary object of this invention to provide a transistor having improved high frequency performance and short-circuit stability.

Conventional point contact transistors are generally considered to be limited in their use to relatively low frequency circuits. A point contact transistor may be defined as a transistor where emitter and collector are in rectifying contact with the semi-conducting crystal. Thus, when such devices are used in amplifier circuit their amplification generally drops for signal frequencies in the megacycle (mc.) region. This is believed to be due at least in part to the transit time of the carriers of electric charges. In an N type semi-conducting material which may, for example, consist of germanium and which is assumed to have a P type surface layer, the charge carriers consist of holes. On the other hand, if the semi-conducting material is of the P type which is assumed to have a N type surface layer, the charge carriers are electrons.

The transit time of the holes or electrons is the time it takes them to travel from the emitter electrode to the collector electrode. The transit time may be calculated approximately through use of the expression $S^3/(\rho\mu I_e)$; where S is the distance between the emitter and collector, $\rho$ the resistivity of the semi-conducting material, $\mu$ the mobility of the holes or electrons and $I_e$ the emitter current.

Since an improved frequency response, which may be defined as a measure of the decrease of current amplification with increasing signal frequency, results from a small transit time, it can be seen from the above expression that the frequency response of a transistor can be improved by using a semi-conducting material of high resistivity and providing small spacing between the emitter and collector electrodes.

However, although a decreased emitter-collector or rectifying electrode spacing results in an increased frequency response, the value of the feedback resistance or base resistance of the point contact transistor also increases as the rectifying electrode spacing decreases. As the value of the base resistance increases to a value of the order of 150 ohms or more, the performance of the transistor tends to be unstable or the transistor amplifier tends to oscillate.

It is accordingly a principal object of the present invention, to provide an improved semi-conductor device suitable as an amplifier, oscillator or the like, which will operate satisfactorily at higher frequencies than conventional devices of that type.

A further object of the invention is to provide a transistor suitable as an amplifier, having a lower equivalent base resistance and therefore lower internal feedback than previously known transistor devices, whereby the device of the invention may be utilized, for example in an amplifier circuit which will be more stable and less liable to oscillate than prior circuits of that type.

A still further object of the invention is to provide a point contact transistor which combines a desired high frequency response with a high current gain, a high power gain and low internal feedback.

A transistor which comprises a semi-conducting crystal provided with two closely adjacent emitter and collector electrodes in rectifying contact with one surface region of the crystal, and a base electrode which provides a low-resistance contact with another surface region of the crystal, may in accordance with the invention be provided with point contact emitter and collector electrodes and the crystal may be of a semi-conducting material such, for example, as germanium. Further in accordance with the invention, the resistivity of the material is so chosen with regard to a particular spacing of the rectifying electrodes as to provide an improved frequency response and a low equivalent base resistance, whereby the transistor may provide stable operation in a high frequency signal amplifier circuit or the like.

Further in accordance with the present invention, the resistivity of the semi-conducting material is so chosen from within a particular range of resistivities with regard to a particular rectifying electrode spacing so as to provide a transistor suitable for use in a very high frequency (V. H. F.) oscillator circuit.

The resistivity of semiconductor material may be determined by the presence in the material of atoms of impurity material as described in Chapter 3 of "Crystal Rectifiers" by Torrey and Whitmer, published by McGraw-Hill Book Co., Inc. in 1948 as part of the Massachusetts Institute of Technology Radiation Laboratory Series.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 5, 6:
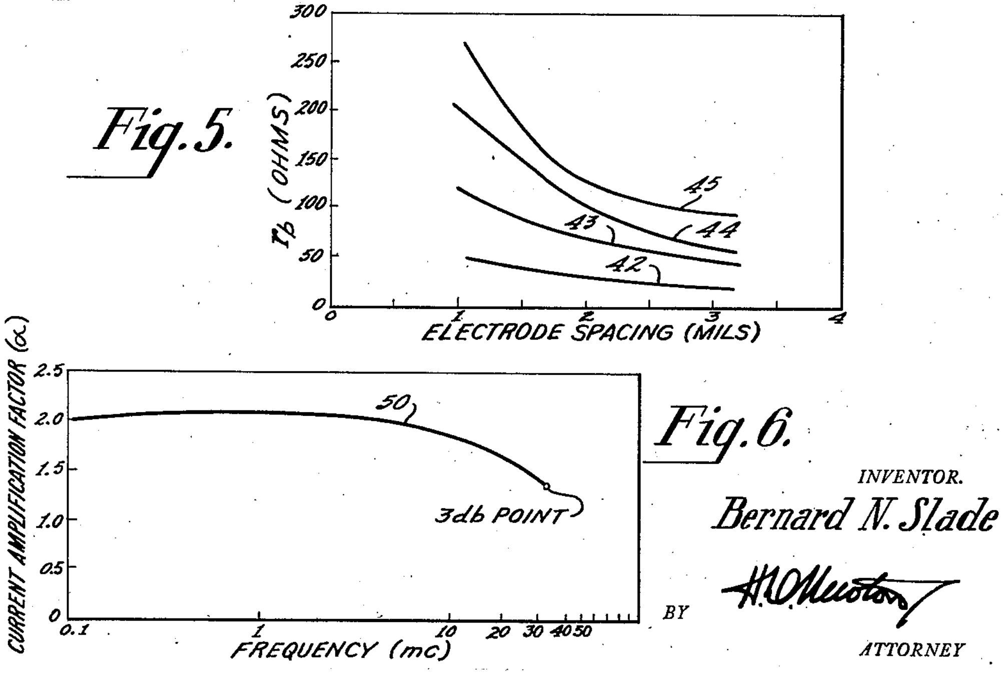

Figure 5 is a graph showing curves of the equivalent base resistance plotted with respect to the spacing of the emitter and collector electrodes of the transistor with various semi-conducting materials of differing resistivities in accordance with the present invention, and Figure 6 is a graph showing the current amplification factor plotted with respect to frequency for a device constructed in accordance with the invention.

Figure 1:
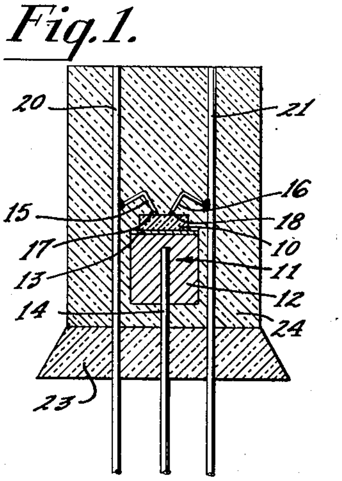
Figure 1 is an elevational view, partly in section, of a transistor embodying the invention.

Referring now to Figure 1 a semi-conductor device or point contact transistor in accordance with the present invention, includes a semi-conducting body such as a block 10 of semi-conducting material of generally well known rectangular shape. The block 10 may, for example be a crystal of silicon, germanium, selenium or tellurium having a predetermined resistivity as will hereinafter be more fully disclosed. Germanium is the presently preferred material for the block 10 and may be prepared to permit the block 10 to operate in the device as an N type semi-conductor body. The surface of block 10 may be and preferably is polished and etched according to present practice.

The block 10 is soldered or sweated to a suitable supporting means such as a stand 11 of nickel or any other suitable electrical conductor. The stand 11 comprises a vertical portion 12 and a horizontal portion 13, and may be fabricated from a single piece of metal. The stand 11 accordingly provides the base electrode of the device which is in low-resistance, non-rectifying contact with body 10. A stiff wire or pin 14 of conducting material such as a heavy nickel wire is soldered or otherwise secured to the stand 11 to provide electrical contact with the semi-conducting block 10, which with the stand 11 and the pin 14, forms the first sub-assembly of the complete transistor device.

Rectifying electrodes 15 and 16 which represent the emitter and collector electrodes respectively consist of fine, slightly resilient or flexible filaments or wires having pointed ends or contact points 17 and 18. The electrodes 15 and 16 may be made, for example, from phosphor bronze wire having a diameter of between 3 and 5 mils, and are resiliently maintained in rectifying contact with the semi-conducting body 10.

The electrodes 15 and 16 are soldered to the supports 20 and 21. The latter may each consist of a heavy nickel wire embedded in and extending through a cylindrical body 23 which may consist, for example, of a suitable insulating material such as glass. The pin 14 and the supports 20 and 21 are preferably mounted in a cylindrical base 23. Preferably, the pin 14 and the supports 20 and 21 are arranged in a common plane and extend through the bottom of cylinder 23 to form pins which fit a standard subminiature tube socket.

The cylindrical base 23, supports 20, 21 and wires 15 and 16 form the second sub-assembly of the complete device. The first and second sub-assemblies forming the complete device are embedded in a cylindrical body 24 of a suitable thermosetting resin such, for example, as Araldite. The purpose of embedding the device in a holding means is to protect the semi-conducting block 10 and the electrodes 15 and 16 from mechanical damage and from the deleterious action of the air, and moisture and chemicals therein.

In accordance with the present invention the spacing between the rectifying electrodes 17 and 18 is less than 2 mils, as an upper limit, and may be as small as is practical, approximately 0.5 mil. Preferably the spacing is between 1 and 0.5 mil. The resistivity of block 10 lies within a range of 0.1 to 2 ohm-centimeters and preferably within the range of 0.5 to 1.7 ohm-centimeters.

To provide short-circuit stable transistors particularly suitable for amplifier circuits the resistivity of the germanium comprising block 10 has a value, in accordance with the present invention, which lies within a particular range of resistivities determined by the value of the spacing or distance between the contact points or areas of the electrode contact points 17 and 18 with the crystal 10. For an electrode spacing approximately equal to 1 mil the resistivity of the block 10 for a short-circuit stable transistor lies within the range of approximately 1.2 to approximately 1.7 ohm-centimeters (ohm-cm.). For a spacing approximately equal to 0.5 mil (.0005") the resistivity of the block 10 lies within the range of approximately 0.5 to approximately 0.8 ohm-cm.

Further, in accordance with the present invention, to provide a transistor adapted for use in a V. H. F. oscillator circuit the spacing of electrode contact points 17 and 18 is approximately equal to 0.5 mil and the resistivity of block 10 lies within the range of approximately 0.8 to approximately 1.2 ohm-cm. Such a transistor is not short-circuit stable and preferably provides appreciable current gain.

As hereinbefore stated a decrease in the spacing between the emitter and collector electrodes results in an improved frequency response of the device, but however tends to make the operation of the device unstable due to the increased value of the effective base resistance.

Figure 2:
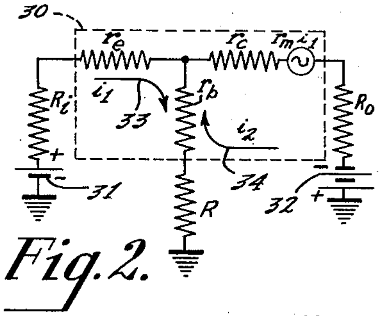
Figure 2 is an equivalent schematic circuit diagram of a transistor amplifier in accordance with the invention, the transistor of Figure 1 being represented as an equivalent T network therein.

For a better understanding of the effect of the base resistance on stability, reference is now made to Figure 2 which illustrates the equivalent circuit diagram of a transistor amplifier.

The T network enclosed within dotted box 30 schematically represents the transistor. The external input and output resistors $R_i$ and $R_o$ have been shown in Figure 2 as well as batteries 31 and 32 which apply bias voltage to the emitter and collector respectively. R indicates the external base resistance. The T network consists of a vertical branch consisting of resistor $r_b$ and of a horizontal branch including resistors $r_e$ and $r_c$, to the junction point of which $r_b$ is connected. A generator having zero impedance is also indicated in Figure 2 represented by the product of $r_m$ and $i_1$, where $i_1$ indicates a current flowing in the direction shown by the arrow 33, $i_2$ indicates a current flowing in the direction shown by the arrow 34.

For purposes of this discussion it is desirable to introduce the following symbols. Thus, $R_{11}=r_e+r_b$; $R_{21}=r_m$; $R_{12}=r_b$ and $R_{22}=r_c+r_b$. $R_{11}$ is the equivalent emitter resistance, $R_{21}=r_m$ is the transfer resistance, $R_{12}=r_b$ is the equivalent base or feedback resistance and $R_{22}$ is the equivalent collector resistance.

Although this discussion is particularly directed to the effect of the equivalent base resistance, $r_b$, upon stability, reference is made to a paper by J. Bardeen and W. H. Brattain which appears on pages 239 to 277 of the April 1949 issue of "Bell System Technical Journal" and which is entitled "Principles involved in transistor action" (see particularly pages 249–251), for a further explanation of the equivalent emitter and collector resistances and of the transfer resistance.

Referring now again to the circuit diagram of Figure 2, the equivalent base or feedback resistance $r_b$ may be defined by the partial differential quotient of the emitter voltage with respect to the collector current while the emitter current is maintained constant. The collector current $i_2$ flows through the equivalent base resistance $r_b$ in a direction opposite to that of the emitter current $i_1$. The collector current, therefore, affects the emitter current and an increase of the collector current lowers the potential of the crystal surface in the vicinity of the emitter and increases the effective bias on the emitter by an equivalent amount. The emitter current $i_1$, is, therefore, a function of the applied potential from battery 31 and the potential represented by $i_2\ r_b$. An increase in $i_1$ by a change in applied potential from battery 31 results in an increase in $i_2$, which by virtue of the feedback still further increases $i_1$. Instability may result. Thus, it is desirable to keep the base resistance $r_b$ as small as possible, if the transistor is to be used, for example, in an amplifier circuit.

Reference is also made to a paper by R. M. Ryder and R. J. Kircher which appears on pages 317 to 401 of the July 1949 issue of "The Bell System Technical Journal" and which is entitled "Some circuit aspects of the transistor" wherein the following criterion for transistor stability has been derived:

$$\frac{R_e}{R_b}+\frac{R_e}{R_c}+1>\frac{r_m}{R_c}$$

and where $R_e=r_e+$external emitter resistance
$R_b=r_b+$external base resistance
$R_c=r_c+$external collector resistance For short-circuit stability, the transistor must be stable without external resistances in series with any of the three terminals of the transistor. Therefore, $$\frac{r_e}{r_b}+\frac{r_e}{r_c}+1 \text{ must be greater than } \frac{r_m}{r_c}.$$

$$\frac{r_m}{r_e}$$

is equal to the current amplification factor, $\alpha$. A large value of $r_e$ may cause the left side of the expression to become less than $$\frac{r_m}{r_e}$$

depending on the values of the other resistances. A high value of $r_b$ can easily cause the transistor to become unstable, and oscillate unless the value of $\alpha$ is unity or less. Most point-contact transistors have an $\alpha$ of two or greater.

The electrical characteristics of the device of the invention will now be explained. To this end reference is made to Figure 3 which shows the effect of the rectifying electrode spacing and resistivity on the current gain cutoff frequency. The current gain cutoff frequency may be defined as that frequency at which the current gain of the device has decreased 3 db below the current gain at low frequencies. Curves 35, 36, 37 and 38 are obtained for transistor devices incorporating semi-conducting materials having resistivities of approximately 4, 3.3, 2 and 1.2 ohm-cm. respectively. It is apparent from the curves 35–38 that the current gain cutoff frequency is affected only slightly by a variation of the resistivity of the material, provided the rectifying electrode spacing is small, for example, below 2 mils.

Figure 4:
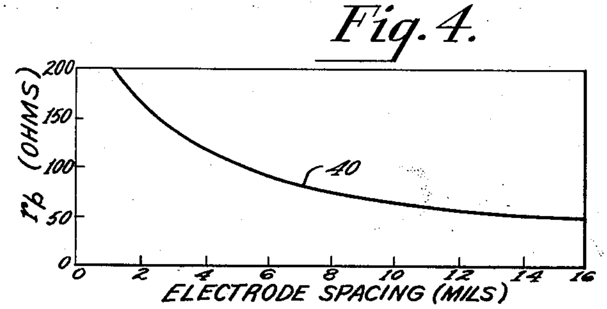

Referring now to Figure 4, curve 40 shows the equivalent base resistance $r_b$ as a function of the rectifying electrode spacing. Curve 40 indicates that as the electrode spacing is decreased to a value below 2 mils, the value of $r_b$ increases rapidly.

Figure 3:
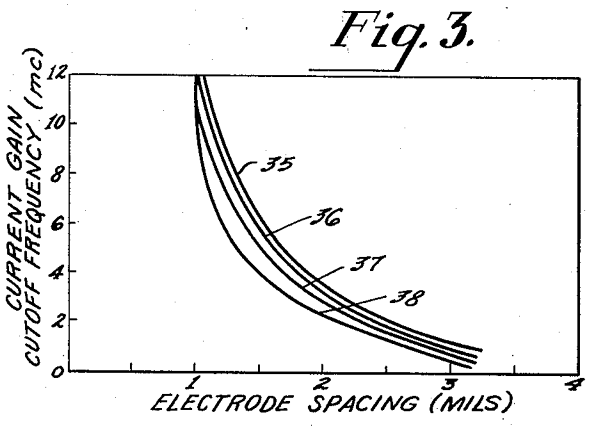
Figures 3 and 4 are graphs showing curves respectively of the current gain cutoff frequency and the equivalent base resistance plotted with respect to the spacing of the emitter and collector electrodes of the semi-conductor device of Figure 1 in accordance with the present invention.

It is, therefore, obvious from an inspection of Figures 3 and 4 that while a desired increase of frequency response is attained by a small spacing, preferably less than 2 mils, it is also apparent that the equivalent base resistance $r_b$ increases. As explained above, if the transistor is to be employed in an amplifier circuit, a large value of $r_b$, above 150 ohms, for example, is not desired for the reason that $r_b$ provides a positive feedback, and if it becomes too large the transistor device may again become unstable.

Reference is now made to Figure 5 wherein curves 42, 43, 44 and 45 indicate the equivalent base resistance as a function of the spacing of the emitter and collector electrodes for devices employing semi-conducting materials of different resistivities. Curves 42, 43, 44 and 45 are plotted for materials having resistivity of 1.2, 2.0, 3.3 and 4.1 ohm-cm., respectively. It can be seen from the curves that as the resistivity of the material is lowered, not only does the value of $r_b$ decrease, but it also becomes less dependent upon changes in contact spacing.

It is now obvious that by decreasing the rectifying electrode spacing of transistors and by employing a semi-conducted material having a low value of resistivity the desirable characteristic of high frequency response and low equivalent resistance are attained.

Furthermore it may now be seen that by proper choice of the rectifying electrode spacing and semi-conductor resistivity in accordance with the invention a short-circuit stable transistor may be provided which because of a relatively low value of $r_b$, is particularly suitable for use as a high frequency amplifier alternately, by proper choice of electrode spacing and resistivity a transistor having a relatively large value of $r_b$ may be provided for use with a V. H. F. oscillator.

Reference is now made to Table I below, wherein the equivalent base resistance and power gains of three groups of transistors made in accordance with the present invention are compared.

*Table I*

| Transistor Group | | A | B | C |
|---|---|---|---|---|
| Average | $r_b$ in ohms | 60-70 | 60-70 | 150 |
| Average | Power Gain in db | 16 | 18 | 20 |

The transistors in group A were made with a rectifying electrode spacing of approximately 1 mil and a germanium resistivity of from 1.2 to 1.7 ohm-cm. The transistors in group B were made with an electrode spacing of approximately 0.5 mil and a resistivity of 0.5 to 0.8 ohm-cm. The transistors of group C were made with a spacing of approximately 0.5 mil and a resistivity of 0.8 to 1.2 ohm-cm.

The group A and group B transistors were all found to be short-circuit stable and therefore particularly adapted for use in amplifier circuits. The transistors of group C, having a relatively large value of $r_b$, were found to be capable of oscillating at frequencies within the vicinity of 200 mc. Four transistors of group C were capable of sustaining oscillations at 192, 200, 215 and 225 mc. respectively.

The curve 50 in Figure 6 shows the current amplification factor, $\alpha$, as a function of frequency. Curve 50 is a typical frequency response curve of a transistor in group B. It is to be noted that the frequency at which the current gain decreased by 3 db, is 30 mc.

There has thus been disclosed an improved semi-conductor device or point contact transistor. The rectifying electrode spacing of the device is preferably maintained below a value of 1 mil. At the same time, the resistivity of the semi-conducting material of the device is maintained within a particular range of values.

By a proper choice of spacing and resistivity there is provided an improved transistor capable of sustaining oscillations of very high frequency. In addition, by a proper selection of resistivity with respect to rectifying electrode spacing there is provided a short-circuit stable transistor having a lower equivalent base resistance and therefore lower internal feedback than previously known transistor devices.

What is claimed is:

1. A point contact transistor comprising a semi-conducting body, a base electrode in low resistance contact with said body, an emitter electrode and a collector electrode in small area rectifying contact with said body, the contact areas of said emitter and collector electrodes with said body being spaced a distance of approximately 0.5 mils, said body being selected from a semi-conducting material having a resistivity of approximately 0.5 ohm-centimeter, thereby to provide a device having a high current gain cutoff frequency.

2. A transistor device comprising a semi-conducting body, said body having two surfaces substantially parallel to each other, a pair of rectifying electrodes contacting one of said surfaces to provide substantially point contacts with said one of said surfaces, the distance between said point contacts of said electrodes being approximately one mil, and a further electrode having a low-resistance contact with said body, said body having a resistivity of approximately two ohm-centimeters.

3. A transistor device comprising a semi-conducting body, said body having two surfaces substantially parallel to each other, a pair of rectifying electrodes contacting one of said surfaces to provide substantially point contacts with said one of said surfaces, the distance between said point contacts of said electrodes being approximately 0.5 mils and a further electrode having a low-resistance contact with said body, said body having a resistivity of approximately 0.5 ohm-centimeters.

4. A point contact transistor comprising a semi-conducting body, a base electrode in low-resistance contact with said body, an emitter electrode and a collector electrode in small area rectifying contact with said body, the contact areas of said emitter and collector electrodes with said body being spaced a distance of approximately 0.5 mil, said body being selected from a semi-conducting material having a resistivity in the range of 0.8–1.2 ohm-centimeters.

5. A point contact transistor comprising a semi-conducting body, a base electrode in low-resistance contact with said body, an emitter electrode and a collector electrode in small area rectifying contact with said body, the contact areas of said emitter and collector electrodes with said body being spaced a distance of approximately 0.5 mil, said body being selected from a semi-conducting material having a resistivity in the range of 0.5–0.8 ohm centimeters.

6. A point contact transistor comprising a semi-conducting body, a base electrode in low-resistance contact with said body, an emitter electrode and a collector electrode in small area rectifying contact with said body, the contact areas of said emitter and collector electrodes with said body being spaced a distance of approximately one mil, said body being selected from a semi-conducting material having a resistivity in the range of 1.2–1.7 ohm-centimeters.

7. A semi-conductor device comprising a semi-conducting body, a base electrode, a small-area emitter electrode and a small-area collector electrode in contact with said body, said emitter and collector electrodes being spaced apart a distance in the range of 0.5 to 2.0 mils, and said semi-conducting body having a resistivity in the range of 0.1 to 2.0 ohm-centimeters.

8. A semi-conductor device comprising a semi-conducting body, a base electrode in ohmic contact with said body, a pointed wire emitter electrode and a pointed wire collector electrode in rectifying contact with said body, said emitter and collector electrodes being spaced apart a distance in the range of 0.5 to 2.0 mils, and said semi-conducting body having a resistivity in the range of 0.1 to 2.0 ohm-centimeters.

References Cited in the file of this patent

UNITED STATES PATENTS

| | | |
|---|---|---|
| 2,524,035 | Bardeen et al. | Oct. 3, 1950 |
| 2,538,593 | Rose | Jan. 16, 1951 |
| 2,563,503 | Wallace | Aug. 7, 1951 |
| 2,577,803 | Pfann | Dec. 11, 1951 |
| 2,627,545 | Muss et al. | Feb. 3, 1953 |